United States Patent [19]

Hara et al.

[11] Patent Number: 4,570,096

[45] Date of Patent: Feb. 11, 1986

[54] ELECTROMECHANICAL TRANSLATION DEVICE COMPRISING AN ELECTROSTRICTIVE DRIVER OF A STACKED CERAMIC CAPACITOR TYPE

[75] Inventors: Atsushi Hara; Takao Horiuchi; Kunio Yamada; Sadayuki Takahashi; Keiji Nakamura, all of Tokyo, Japan

[73] Assignee: NEC Corporation, Tokyo, Japan

[21] Appl. No.: 662,881

[22] Filed: Oct. 19, 1984

[30] Foreign Application Priority Data

| Oct. 27, 1983 | [JP] | Japan | 58-201393 |
| Apr. 17, 1984 | [JP] | Japan | 59-76784 |
| Apr. 17, 1984 | [JP] | Japan | 59-76785 |
| Jul. 4, 1984 | [JP] | Japan | 59-138645 |
| Jul. 4, 1984 | [JP] | Japan | 59-138646 |
| Jul. 4, 1984 | [JP] | Japan | 59-138647 |

[51] Int. Cl.$^4$ ................................. H01L 41/08
[52] U.S. Cl. ..................... 310/328; 310/369
[58] Field of Search ............ 310/323, 328, 330–331, 310/369, 317

[56] References Cited

U.S. PATENT DOCUMENTS

| 3,902,084 | 8/1975 | May, Jr. ........................... 310/328 |
| 3,902,085 | 8/1975 | Bizzigotti ........................ 310/328 |
| 4,219,755 | 8/1980 | O'Neill et al. .................. 310/328 |
| 4,454,441 | 6/1984 | Taniguchi ....................... 310/328 |

FOREIGN PATENT DOCUMENTS

| 1066345 | 11/1979 | Canada ............................ 310/328 |
| 0595813 | 3/1978 | U.S.S.R. .......................... 310/328 |
| 0752560 | 7/1980 | U.S.S.R. .......................... 310/328 |

*Primary Examiner*—Mark O. Budd
*Attorney, Agent, or Firm*—Laff, Whitesel, Conte & Saret

[57] ABSTRACT

In a device of the type of an Inchworm Translator as called by Burleigh Instruments, Inc., N.Y., an electromechanical driver for a shaft of the device comprises a plurality of electrostrictive layers stacked longitudinally of the driver with internal electrodes interposed. Preferably, each gripper or clamper for the shaft is of a like structure and comprises a pair of external electrodes on an outer peripheral surface thereof. More preferably, the gripper comprises either an electrically insulating and abrasion resistive or an electrically insulating and vibration damping film which defines a cylindrical inner peripheral surface of the gripper. The film is preferably divided into a plurality of film portions. The electrostrictive layers are preferably of a composition of a formula of $(1-x)Pb(Mg_{\frac{1}{3}}Nb_{\frac{2}{3}})O_3 \cdot xPbTiO_3$ where x is about 0.35. The electrically insulating and abrasion resistive film may be of either a plastic or a ceramic material. The electrically insulating and vibration damping film may be of a ferrite composition having a logarithmic damping factor between 0.04 and 0.06.

3 Claims, 10 Drawing Figures

ELECTROMECHANICAL TRANSLATION DEVICE COMPRISING AN ELECTROSTRICTIVE DRIVER OF A STACKED CERAMIC CAPACITOR TYPE

BACKGROUND OF THE INVENTION

This invention relates to an electromechanical translation device which is called an INCHWORM TRANSLATOR by Burleigh Instruments, Inc., N.Y.

The electromechanical translation device is for axially moving a shaft with a controllable or incremental step of movement. The step of movement is typically of the order of a micron and may be less. Although each step is small, it is possible to move the shaft over a long distance and at a high speed. The distance may be 50 mm or more. The speed may be 2 mm/sec. The electromechanical translation device is capable of carrying out high resolution positioning, precision measurement, and intelligent electronic control either individually or in combination in, for example, an optical device. Such electromechanical translation devices are disclosed in the specifications of U.S. Pat. No. 3,902,084 issued to William G. May, Jr., and U.S. Pat. No. 3,902,085 issued to Richard A. Bizzigotti, both assigned to the above-mentioned Burleigh Instruments.

As will later be described more in detail, an electromechanical translation device comprises a shaft, a housing defining a hollow space in which the shaft is housed and is extended outwardly of the housing, an electromechanical driver fixed to the housing in the hollow space and having a first and second end surface and a cylindrical driver inner peripheral surface along which the shaft is freely movable, and a first and a second controllable electromechanical gripper or clamper attached in the hollow space to the first and the second end surfaces, respectively. Each of the first and the second grippers has a cylindrical gripper inner peripheral surface along which the shaft is controllably slidably movable. More particularly, each gripper is controllable so as to grip or clamp the shaft and to allow the shaft slidably move along its inner peripheral surface. A driving circuit comprises a power source and switches and is connected to the driver and the first and the second grippers for controllably supplying electric power thereto so as to make the driver and the grippers cooperate in axially stepwise or incrementally moving the shaft as will presently be described more in detail. The driver and the first and the second grippers may be three parts of a single continuous solid piezoelectric or electrostrictive member although it is preferred to individually manufacture the three parts and then assemble the parts into a unitary assembly. The switches preferably comprise switching transistors.

In a conventional electromechanical translation device, a single cylindrical electrostrictive member is used as each of the driver and the first and the second grippers. The electrostrictive member has an outer peripheral surface and comprises a pair of electrodes along the inner and the outer peripheral surfaces, respectively. Responsive to the electric power, each gripper radially contracts and expands to grip and release the shaft, respectively. When the driver axially expands in response to the electric power while the first and the second grippers release and grip the shaft, respectively, the shaft moves in a direction and sense from the second gripper to the first gripper. The first and the second grippers are subsequently caused to grip and release the shaft, respectively, while the driver is left expanded. When the driver thereafter axially contracts, the shaft further moves in the above-defined direction and sense. When the first and the second grippers are subjected to a reversed sequence of operation, the shaft stepwise moves in a reversed direction and sense. A combination of the shaft, the driver, and the first and the second grippers is operable in this manner like an inchworm. It is possible to use an electronic digital computer in controlling supply of the electric power and thereby to move the shaft at a high speed as described before. The computer may be a compact one that is known as a personal computer. At any rate, transverse electrostriction effect or piezoelectric unstiffened mode is used in the driver while longitudinal electrostriction effect of piezoelectric stiffened mode is used in each of the first and the second grippers.

It is well known in the art that the transverse electrostriction effect is weaker than the longitudinal one and is consequently disadvantageous in view of efficiency of the electric power. More particularly, a strain appears as elongation or contraction in an electrostrictive member approximately in linear proportion to the intensity of an electric field produced therein by the electric power. If the electric field has a predetermined intensity, the strain is small when the transverse electrostriction effect is used instead of the longitudinal one. On the other hand, a pair of electrodes must be formed in this event along the first and the second end surfaces, respectively. The driver has typically an inner diameter of 11 mm, a wall thickness of 1 mm, and an axial length of 25.4 mm. More than twenty times as high an electric voltage must therefore be supplied between the electrodes on producing the electric field of the predetermined intensity. The transverse electrostriction effect is used in the driver to avoid this high electric voltage despite the disadvantage in the efficiency. In practice, an expansion or contraction of about 1 micron is attained with application of an appreciably high electric voltage of 600 volts between the electrodes formed on the inner and the outer peripheral surfaces of the driver.

Although the longitudinal electrostriction effect is used in the first and the second grippers, the inner diameter varies only a few microns by application of the appreciably high electric voltage of 600 volts thereto. The shaft and the grippers must therefore be precisely machined in order to achieve free slide of the shaft relative to the gripper inner peripheral surface and also a predetermined gripping force. In fact, the shaft fits the grippers with nearly zero clearance when either of the grippers releases the shaft. This inevitably results in abrasion or wear of the electrode formed along each gripper inner peripheral surface.

The switching transistors must withstand the appreciably high electric voltage of, for example, 600 volts. Each switching transistor must therefore comprise an emitter and a collector electrode of a wide electrode area in order to prevent the current density from becoming excessive at the emitter and the collector electrodes. On carrying out the high-speed operation, the electric current flows only through the surface portion of each electrode due to the skin effect. In order to cope with the skin effect, each of the emitter and the collector electrodes must have a wider electrode area. It is true that a plurality of transistors of a low withstand voltage may be used in place of each switching transistor of a high withstand voltage so as to collectively withstand the appreciably high electric voltage. This, however, gives rise to a problem of delay. Furthermore it is troublesome to select low-withstand voltage transistors of uniform characteristics. In any event, the electromechanical translation device becomes bulky and expensive.

SUMMARY OF THE INVENTION

It is therefore a principal object of the present invention to provide an electromechanical translation device which is operable with electric power of a low electric voltage in axially stepwise moving shaft of the device.

It is another principal object of this invention to provide an electromechanical translation device of the type described, which comprises an electrostrictive driver operable in accordance with longitudinal electrostriction effect.

It is still another principal object of this invention to provide an electromechanical translation device of the type described, in which the electro-strictive driver is of a stacked or laminated ceramic capacitor type.

It is yet another principal object of this invention to provide an electromechanical translation device of the type described, which is compact and inexpensive.

It is a subordinate object of this invention to provide an electromechanical translation device of the type described, which comprises a controllable gripper or clamper having an inner peripheral surface and capable of controllably making the shaft slide along the peripheral surface with abrasion of the peripheral surface put out of problem.

Other objects of this invention will become clear as the description proceeds.

According to one aspect of this invention, there is provided an electromechanical translation device for use in axially stepwise moving a shaft, comprising a housing defining a hollow space in which the shaft is housed and is extended outwardly of the housing, an electromechanical driver fixed to the housing in the hollow space and having a first and a second end surface and a cylindrical driver inner peripheral surface along which the shaft is freely movable, a first and a second controllable electromechanical gripper attached in the hollow space to the first and the second end surfaces, respectively, and having cylindrical gripper inner peripheral surfaces along which the shaft is controllably slidably movable, and power supplying means for controllably supplying electric power to the driver and the first and the second grippers to make the driver and the first and the second grippers cooperate in axially stepwise moving the shaft, wherein the driver comprises a pile of a plurality of electrostrictive layers stacked longitudinally of the driver with internal electrodes interposed between the electrostrictive layers and connecting means for electrically connecting the internal electrodes to the power supplying means.

BRIEF DESCRIPTION OF THE DRAWING

The above and other objects and features of this invention may be fully understood from the following detailed description and the accompanying drawings in which.

DESCRIPTION OF THE PREFERRED EMBODIMENTS

Figure 1:
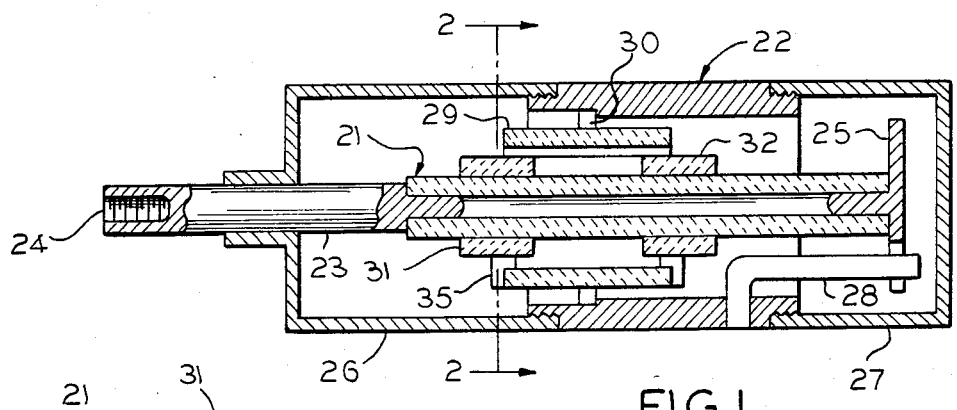
FIG. 1 is a schematic longitudinal sectional view of an electromechanical translation device according to an embodiment of the instant invention.
Figure 2:
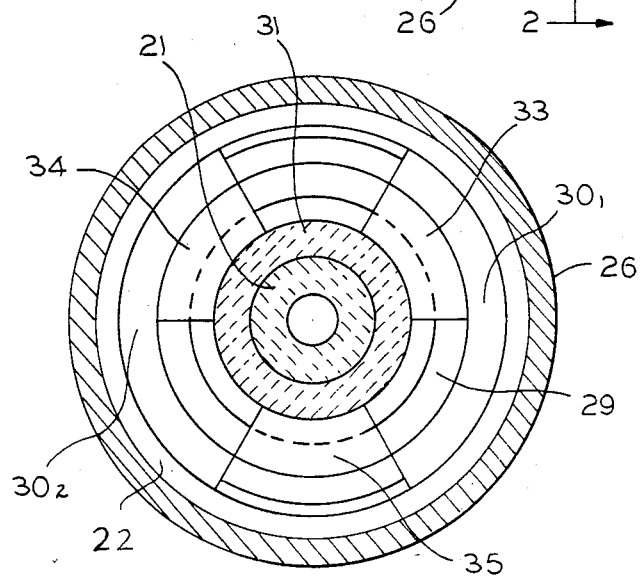
FIG. 2 is an enlarged schematic transverse sectional view taken along a line 2—2 in FIG. 1.

Referring to FIGS. 1 and 2, an electromechanical translation device according to a first embodiment of the present invention is for use in axially stepwise moving a shaft 21 and comprises a housing 22 defining a hollow space in which the shaft 21 is housed and is extended outwardly of the housing 22 as will presently become clear. In the manner described in the May patent specification referred to hereinabove, the shaft 21 comprises a main body preferably made of a ceramic material or a like electrically insulating material having a low thermal expansion coefficient and may further comprise a spindle 23 which is made preferably of a metallic material of a low thermal expansion coefficient and is attached to a first end of the main body by an epoxy or a like adhesive. The spindle 23 is extented from the hollow space to the outside of the housing 22 and has a tip portion in which a machine screw 24 is provided for attachment of a load (not shown) to the shaft 21. In the example being illustrated, the shaft 21 comprises a flange 25 attached to a second end of the main body. Again as in the May patent specification, the housing 22 comprises a main body having a first and a second threaded end and first and second sections 26 and 27, each having a threaded end which is brought into engagement with the pertinent one of the first and the second threaded ends. The main body and the first and the second sections 26 and 27 provide a unitary housing assembly. The flange 25 has a U-shaped cut from its periphery towards the center. An L-shaped rod member 28 is fixed to the main body of the housing 22 and is in sliding fit in the U-shaped cut of the flange 25 so as to prevent the shaft 21 from rotating around its axis.

An electrostrictive driver 29 is of a hollow cylindrical shape having a first and a second end surface and an inner and an outer cylindrical driver peripheral surface and is fixed to the housing 22 in the hollow space and coaxially of the shaft 21 by means of a main holding member 30. The main holding member 30 is made of a ceramic material of a like electrically insulating material having a low thermal expansion coefficient. In the example being illustrated, the holding member 30 comprises first and second sector portions 30₁ and 30₂, each having a central angle of 120° as best shown in FIG. 2. Outer peripheral ends of the sector portions 30₁ and 30₂ are received at a shoulder of the housing 22. Free ends are fixed to an axially or longitudinally central portion of the driver 29 by an epoxy adhesive. According to this invention, the driver 29 is of a stacked ceramic capacitor type. As will later be described in detail, the stacked ceramic capacitor type driver 29 comprises a pile of a plurality of electrostrictive layers of a ceramic electrostrictive material. The electrostrictive layers are stacked into the pile longitudinally of the driver 29 with internal electrodes interposed between the electrostrictive layers. A first and a second external electrode are formed along the driver outer peripheral surface. The first external electrode is electrically connected to alternating ones of the internal electrodes. The second external electrode is connected to remaining ones of the internal electrodes. When electric power is supplied between the first and the second external electrodes, the driver 29 longitudinally expands in accordance with longitudinal electrostriction effect of the electrostrictive material. When the electric power is removed, the driver 29 longitudinally contracts back to the original length.

The ceramic material of the shaft 21 and the main holding member 30 should preferably have a thermal expansion coefficient which is substantially equal to that of the electrostrictive material.

First and second controllable electrostrictive grippers or clampers 31 and 32 are disposed in the hollow space of the housing 22 and coaxially of the shaft 21 and are attached to the first and the second end surfaces of the driver 29, respectively. Each of the first and the second grippers 31 and 32 is of a hollow cylindrical shape having an inner and an outer cylindrical gripper peripheral surface. The shaft 21 is controllably slidable along the inner peripheral surface of each gripper 31 or 32. An auxiliary holding member comprises three sector portions 33, 34, and 35 as best shown in FIG. 2 and is used in attaching each gripper 31 or 32 to the relevant one of the first and the second end surfaces. In the embodiment being illustrated, each gripper 31 or 32 is partly received in the driver 29 and comprises a single electrostrictive member and a pair of electrodes (not shown) along the inner and the outer gripper peripheral surfaces, respectively. The single electrostrictive member is preferably of the electristrictive material of the electrostrictive layers of the driver 29. Each gripper 31 or 32 is capable of radially expanding and contracting in accordance with the longitudinal electrostriction effect of the electrostrictive material to release and grip or clamp the shaft 21, respectively, as in the device according to May, Jr. Preferably, the auxiliary holding members 33 through 35 should also be made of a ceramic material or a like electrically insulating material having a low thermal expansion coefficient which is substantially equal to that of the electrostrictive material.

Figure 3:
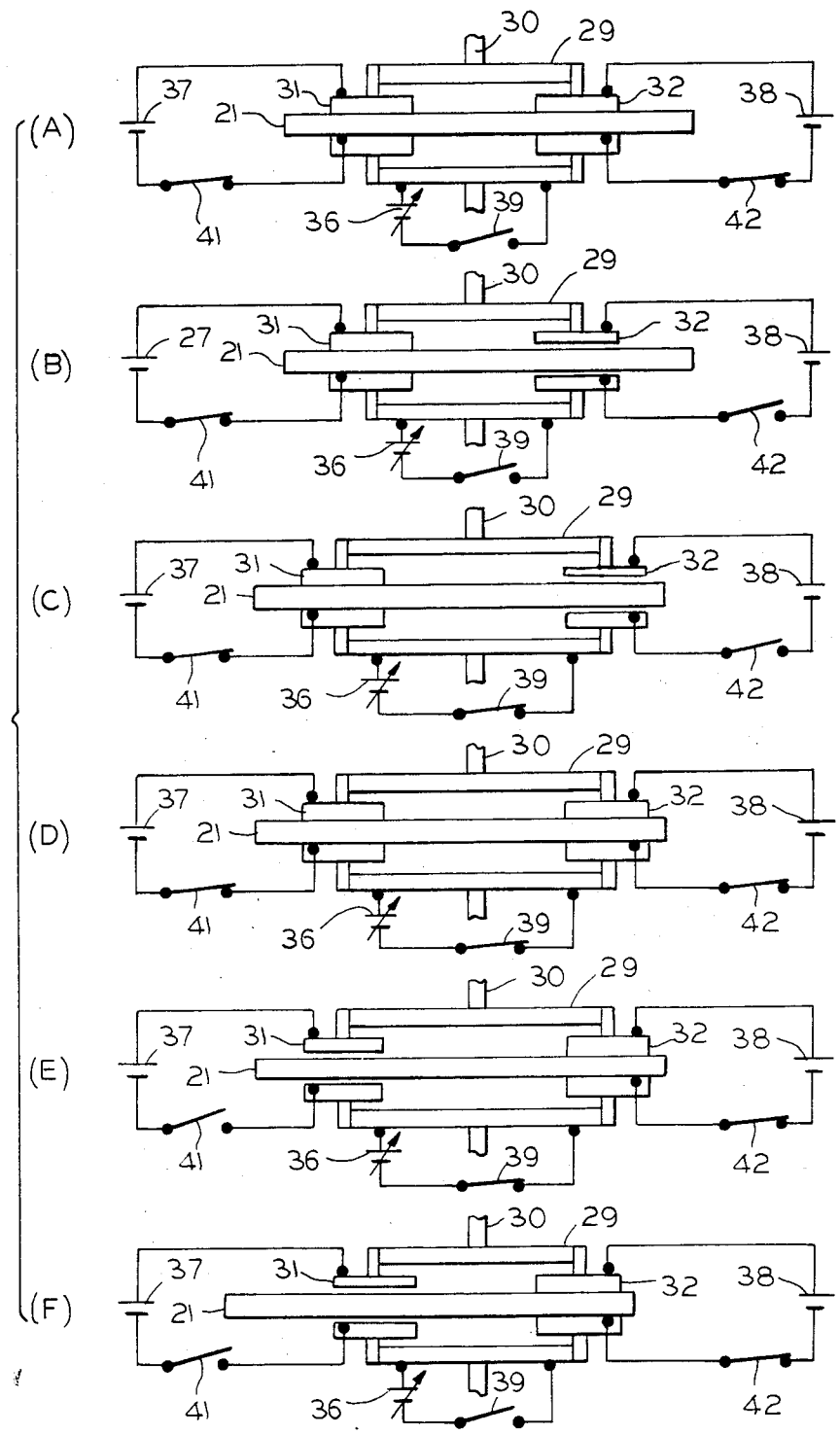
FIG. 3 schematically shows side views of the electromechanical translation device depicted in FIGS. 1 and 2, together with a driving circuit of the device, for use in describing operation of the device.

Turning to FIG. 3, the electromechanical translation device is represented only by the shaft 21, the driver 29, the main holding member 30, and the first and the second grippers 31 and 32 and comprises a driving circuit comprising a driver power source 36, first and second gripper power sources 37 and 38, a driver switch 39, and first and second switches 41 and 42. It is assumed that the external electrodes of the driver 29 are extended along that portion of the driver outer peripheral surface which is depicted at the bottom of the driver 29. The driver power source 36 is adjustable so as to select the step of movement of the shaft 21. Although three power sources 36 through 38 are separately illustrated, it is possible to use a single power source therefor.

In the manner depicted along a top or first line labelled (A), let the first and the second switches 41 and 42 be closed at first with the driver switch 39 left open. The shaft 21 is gripped by the first and the second grippers 31 and 32. As shown along a second line labelled (B), let the second switch 42 be open with the driver and the first switches 39 and 41 kept open and closed, respectively, as before. The second gripper 32 releases the shaft 21. As illustrated along a third line labelled (C), the driver switch 39 is now closed with the first and the second switches 41 and 42 kept closed and open, respectively. The driver 29 longitudinally expands on both sides of the main holding member 30 to axially move the shaft 21 in a direction and sense from the second gripper 32 to the first gripper 31.

As shown along a fourth line (D) of FIG. 3, the second switch 42 is closed with the driver and the first switches 39 and 41 left closed as before. The second gripper 32 grips the shaft 21 at a position displaced in a reversed derection and sense which is from the first gripper 31 to the second gripper 32. As depicted along a fifth line labelled (E), the first switch 41 is open with the driver and the second switches 39 and 42 kept closed. The first gripper 31 releases the shaft 21. As shown in a bottom line labelled (F), the driver switch 39 is now open with the first and the second switches 41 and 42 left open and closed, respectively. The driver 29 longitudinally contracts to place the second gripper 32 back to the position illustrated in the top line (A) and thereby to axially move the shaft 21 further in the first-mentioned direction and sense. The shaft 21 axially stepwise moves in this manner. As described heretobefore, a combination of the shaft 21, the driver 29, and the first and the second grippers 31 and 32 is operable like an inchworm.

Figure 4:
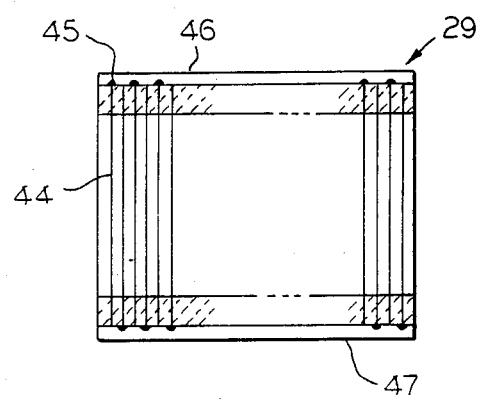
FIG. 4 is a schematic axial sectional view of a driver used in the electromechanical translation device illustrated in FIGS. 1 and 2.

Referring now to FIG. 4, the driver 29 is of the stacked ceramic capacitor type which has briefly been described before. The above-mentioned internal electrodes are depicted at 44. The driver 29 comprises a pile of a plurality of electrostrictive layers which are illustrated with hatches and are stacked longitudinally of the driver 29 with the internal electrodes 44 interposed. Each internal electrode 44 has an outer and an inner peripheral end exposed along the driver outer and inner peripheral surfaces, respectively. As will later be described more in detail, masses of an insulating material 45 are attached to the outer peripheral ends of the internal electrodes 44 to leave outer peripheral end portions of alternating ones of the internal electrodes 44 exposed along a generating line of the driver outer peripheral surface. Similarly, masses of the insulating material are applied to the outer peripheral ends of the internal electrodes 44 to leave outer peripheral end portions of remaining ones of the internal electrodes 44 exposed along another generating line. First and second external electrodes 46 and 47 are formed along the two generating lines, respectively, in electrical contact with the exposed outer peripheral portions. The external electrodes 46 and 47 are dipicted on diametrical ends of the gripper 31 or 32 merely for clarity of illustration.

It has already been reported by Sadayuki Takahashi et al. of NEC Corporation, Tokyo, Japan, that a ceramic material shows a strong electrostriction effect with excellent temperature characteristics and yet has a low dielectric constant when the ceramic material is a two-composition solid solution of lead magnesium-niobate and lead titanate and has a formula given by $(1-x)\text{Pb}(\text{Mg}_{1/3}\text{Nb}_{2/3})\text{O}_3 \cdot x\,\text{PbTiO}_3$ where x is about 0.35. After poled, a strain of $8.7 \times 10^{-4}$ appears parallel to the electric field of $1 \times 10^6$ volts/meter. The longitudinal or parallel strain is about 1.5 times the purely piezoelectric parallel strain.

Based on the report of Takahashi et al, a mixture of calcined powder of the solid solution and a conventional organic binder was suspended in a known organic solvent and subsequently milled into a slurry. By resorting to the doctor blade technique known in the art, the slurry was cast on an organic film to provide a green sheet of a thickness selected between a few tens to several hundreds of microns. It is known that the organic film is preferably a polyester film known by the trade name of MYLAR of Du Pont. Metal paste was printed on the green sheet to provide a metal covered sheet comprising a conductive film on the green sheet. A plurality of the metal covered sheets were stacked and then sintered into a lamination under pressure.

The lamination was punched into a cylindrical shape. The precision of punching was about 5 microns. The cylindrical shape was polished into a cylinder by using a jig. In the cylinder, the green sheets became the electrostrictive layers. The conductive films became the internal electrodes 44. A provisional electrode for electrophoresis was formed along a generating line of the cylinder in electrical contact with the exposed prepheral ends of the internal electrodes 44.

Figure 5:
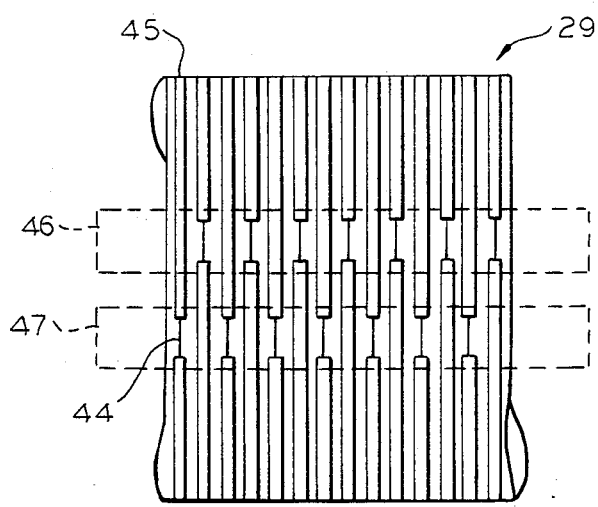
FIG. 5 is an enlarged side view of a part of the driver under manufacture.

Turning to FIG. 5 for a short while, glass was applied to the cylinder by the technique of electrophoresis. After the provisional electrode was removed and the glass was removed partly along two generating lines of the cylinder to form a pair of external electrodes 46 and 47, the remained glass was fired to the cylinder to provide the masses of the insulating material 45. The first and the second external electrodes 46 and 47 were formed along the outer driver peripheral surface to partly cover the masses of the insulating material 45 and to be in electrical contact with the internal electrodes 44 as described in connection with FIG. 4.

A plurality of electrostrictive elements were manufactured in the manner described above. Each element had an outer diameter of 20 mm, an inner diameter of 15.6 mm, and a length of 13 mm and comprised fifty-four electrostrictive layers with a center to center distance of 230 microns between two adjacent ones of the internal electrodes 44. Two of the elements were assembled in end to end contact into each driver 29. Before assembled, each element had an electrostatic capacity of less than 900 nanofarads. The longitudinal or parallel strain was measured for each element by using an electronic micrometer of a resolution of 0.1 micron. When a d.c. voltage was applied to each element and varied from 0 to 200 volts, the strain approximately linearly changed from 0 to about 10 microns. When a pulse of a pulse height of 230 volts ($1 \times 10^6$ volts/meter) and a pulse width of 0.4 milliseconds was applied, the strain instantaneously responded to the pulse. More specifically, the response time was less than 10 microseconds. Even when the pulse was repeatedly applied more than 500,000,000 times, the elements were not degraded at all. The electromechanical coupling factor of the electrostrictive material was 70 percent for the voltage of 230 volts.

Referring to FIGS. 1 and 2 again, an electromechanical translation device according to a second embodiment of this invention comprises similar parts designated by like reference numerals. Each of the first and the second grippers or clampers 31 and 32 is, however, not a single solid electrostrictive member but an electrostrictive member of the stacked ceramic capacitor type. Transverse electrostriction effect is used in each gripper 31 or 32 in consideration of the advantages which will later become clear from the following description.

In the manner described above with reference to FIGS. 4 and 5, electrostrictive elements were manufactured with the outer and the inner diameters of 13.6 mm and 10.64 mm. Each element had an electrostatic capacity of a little more than 400 nanofarads.

Each electrostrictive element was used as a gripper or clamper pile of a plurality of electrostrictive gripper layers which are stacked transversely of the gripper inner peripheral surface with gripper internal electrodes interposed between the gripper layers as depicted in FIG. 4 at 44. As described before, each gripper 31 or 32 has a gripper outer peripheral surface. A first and a second gripper external electrode are formed along two generating lines of the gripper outer peripheral surface as examplified at 46 and 47 in conjunction with FIGS. 4 and 5. The gripper pile has an inner peripheral surface which serves as the gripper inner peripheral surface.

A transverse or perpendicular strain was measured by a decrease in the outer diameter for ease of measurement. When the d.c. voltage was varied from 0 to 200 volts as before, the strain approximately linearly changed from 0 to 6 microns. The transverse strain was considerably greater than the longitudinal or parallel strain of 0 to a fraction of micron (for the d.c. voltage of 0 to 200 volts) of a conventional gripper of an outer diameter of 13.6 mm, an inner diameter of about 10.6 mm, and a length of 12.4 mm. This is because the conventional gripper has a distance of more than 1 mm between the (external) electrodes in contrast to the distance of about 230 microns between two adjacent ones of the internal electrodes 44 of the element.

Now that the strain was measured, it is possible with reference to general formulae for the shrinkage fit to calculate the gripping or clamping force applied by the gripper 31 or 32 to the shaft 21. The main body of the shaft 21 was made of 96% alumina, which had a Young's modulus of 32,000 kg/mm$^2$ and a Poisson's ratio of 0.23. The electrostrictive material had a Young's modulus of 4,100 kg/mm$^2$ and a Poisson's ratio of 0.29. For a main body of the shaft 21 of an outer diameter of 10.640 mm, the gripping force appears when the d.c. voltage is about 20 volts and linearly increases to 0.22 kg/mm$^2$ when the voltage is raised to 200 volts. For a main body of an outer diameter of 10.638 mm, the gripping force appears when the voltage is nearly 90 volts and increases to about 0.14 kg/mm$^2$ when the voltage is raised to 200 volts. For a main body of an outer diameter of 10.636 mm, the gripping force appears when the voltage is a little above 150 volts and increases to 0.05 kg/mm$^2$ when the voltage is raised to 200 volts. It is now clear that the element is well operable as the gripper 31 or 32 with an appreciably low voltage when compared with the appreciably high voltage of 600 volts which is necessary for a conventional electromechanical translation device. This makes it possible to use switching transistors of a low withstand voltage. What is important is the fact that no electrode is necessary along the gripper inner peripheral surface. Incidentally, it is possible to manufacture the drivers 29 and the grippers 31 and 32 on a large scale with an excellently high reliability.

Figure 6:
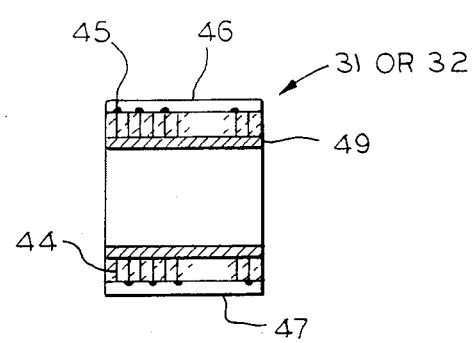
FIG. 6 is a schematic axial sectional view of a gripper for use in an electromechanical translation device according to another embodiment of this invention.

Referring now to FIG. 6, a gripper or clamper 31 or 32 (FIGS. 1 and 2) is for use in an electromechanical translation device according to a third embodiment of this invention. It is to be noted in connection with the gripper 31 or 32 illustrated with reference to FIG. 4 that the internal electrodes 44 have inner peripheral ends exposed on the gripper inner peripheral surface. The inner peripheral ends are therefore ground into conductive powder by the shaft 21 (FIGS. 1 and 2) sliding along the gripper inner peripheral surface. The conductive powder deteriorates the electrical insulation between the inner peripheral ends of the internal electrodes 44. In order to avoid the deterioration, an electrically insulating and abrasion resistive film 49 is formed along the gripper inner peripheral surface. More specifically, the film 49 has an exposed or inner peripheral surface which defines the gripper inner peripheral surface. The film 49 may be made of either a plastic material or a ceramic material. It is preferred that the ceramic material should have a high Young's modulus.

In FIG. 6, it is to be noted that the electrically insulating and abrasion resistive film 49 is somewhat objectionable. If the film 49 is thin, such as of a thickness of the order of 1 micron, the film 49 is subjected to breakage by the repeated expansion and contraction of the gripper 31 or 32 because the shift 21 (FIGS. 1 and 2) is in sliding contact with the gripper inner peripheral surface with substantially zero clearance. If thick, the film 49 adversely affects the expansion and the contraction of the gripper 31 or 32. In a worst case, the gripper 31 or 32 can not grip or clamp the shift 21.

Figures 7, 8:
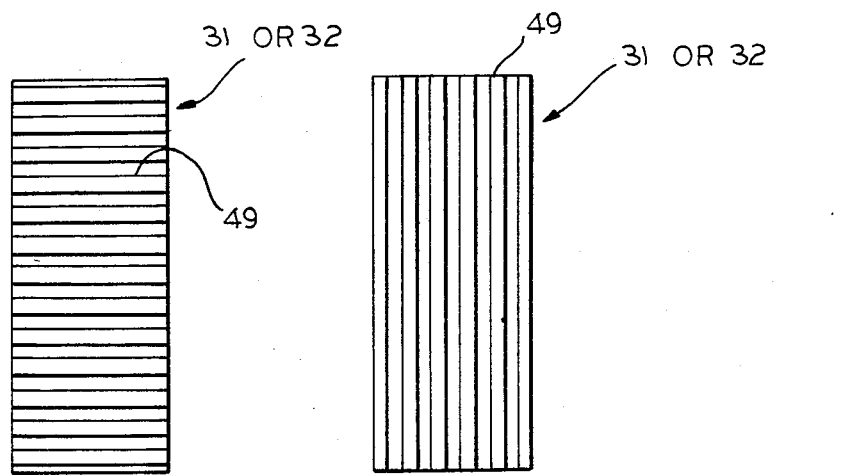
FIG. 7 is an expanded view of an inner peripheral surface of a gripper for use in an electromechanical translation device according to still another embodiment of this invention, with the inner peripheral surface cut along a generating line of the inner peripheral surface.
FIG. 8 is a similar expanded view of an inner peripheral surface of a gripper for use in a modification to the electromechanical device mentioned in conjunction with FIG. 7.

Referring to FIG. 7 in addition to FIG. 6, a gripper or clamper 31 or 32 is for use in an electromechanical translation device according to a fourth embodiment of this invention. The gripper 31 or 32 comprises a plurality of electrically insulating and abrasion resistive films along the gripper inner peripheral surface as collectively shown at 49 in FIG. 6 and more particularly depicted in FIG. 7. The films 49 have exposed surfaces which define the gripper inner peripheral surface. In FIG. 7, the films 49 are spaced from one another circumferentially of the gripper inner peripheral surface by gaps or grooves formed therebetween. The gaps provide allowance for those expansion and contraction of the films 49 which are caused by the expansion and the contraction of the gripper 31 or 32.

Turning to FIG. 8, a modification to the gripper 31 or 32 comprises a plurality of electrically insulating and abrasion resistive films 49 like the gripper 31 or 32 illustrated with reference to FIGS. 6 and 7. The films 49 are spaced from one another along a cylindrical axis of the gripper inner peripheral surface.

Figures 9, 10:
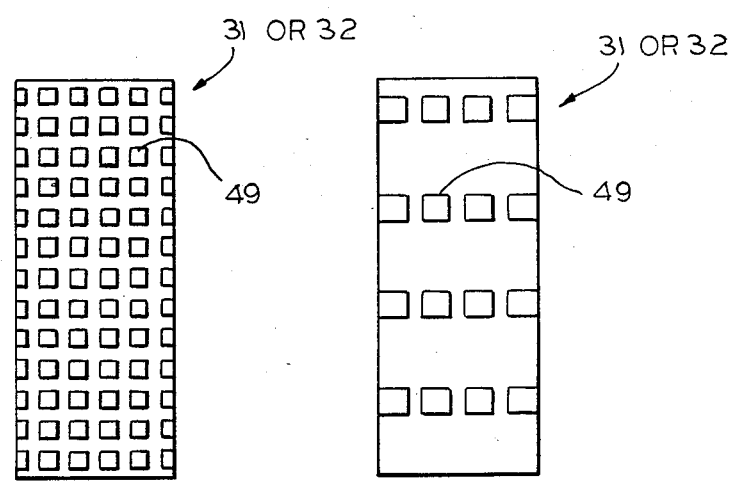
FIG. 9 is a like expanded view of an inner peripheral surface of a gripper for use in another modification to the device of FIG. 7.
FIG. 10 is a likewise expanded view of an inner peripheral surface of a gripper for use in still another modification to the device of FIG. 7.

Further turning to FIG. 9, another modification to the gripper 31 or 32 comprises a plurality of electrically insulating and abrasion resistive films 49 like in FIGS. 7 and 8. The films 49 are arranged in a matrix fashion along a cylindrical axis of the gripper inner peripheral surface and circumferentially thereof.

Still further turning to FIG. 10, still another modification to the gripper 31 or 32 again comprises a plurality of electrically insulating and abrasion resistive films 49 like in FIG. 9. The spacings are wider than those in FIG. 9 circumferentially of the gripper inner peripheral surface.

Finally referring to FIG. 6 once again, a gripper or clamper 31 or 32 is for used in an electromechanical translation device according to a fifth embodiment of this invention. It should be noted that the grippers 31 and 42 are subjected to vibration of a high frequency when the device is put into operation by a high frequency pulse sequence. The vibration is transmitted to various parts of the gripper 31 or 32 to provide nodes and loops and results in much complicated higher-order vibrations. Such vibrations not only generate noise but also severely adversely affect the precise operation of the device. The gripper 31 or 32 therefore comprises an electrically insulating and vibration damping film along the gripper inner peripheral surface as again indicated at 49. The film 49 has an exposed surface which defines the gripper inner peripheral surface.

In order that the film 49 may well absorb the vibrations and be electrically insulating at the same time, it is preferred to use a composition of ferrite and an organic resin. The composition should have a density between $3.0 \times 10^3$ and $3.5 \times 10^3$ kg/m$^3$, a Young's modulus between $18 \times 10^9$ and $27 \times 10^9$ N/m$^2$, and a logarithmic damping factor between 0.04 and 0.06. Such a composition is manufactured and sold in the trade name of Ferriston by Nippon Electric Environment Engineering Co., Tokyo, Japan.

While this invention has thus far been described in specific connection with several preferred embodiments thereof and a few modifications, it will now readily be possible for one skilled in the art to carry this invention into effect in various other manners. Above all, it should be noted that the driving circuit has not been described in detail because the invention is mainly directed to other parts of the electromechanical translation device. If desired, reference should be had to the above-cited May patent specification as regards the driving circuit. The electrically insulating and vibration damping film 49 may be divided into a plurality of film portions.

What is claimed is:

1. An electromechanical translation device for axially moving a shaft in a stepwise manner, said device comprising:

a housing defining a hollow space in which said shaft is housed and from which it is extended outwardly of said housing;

an electromechanical driver fixed to said housing within said hollow space and having first and second end surfaces, a cylindrical driver having an inner peripheral surface along which said shaft is freely movable and an outer peripheral surface, said driver comprising a pile including a plurality of electrostrictive driver layers which are stacked longitudinally along said driver, with internal driver electrodes interposed between said electrostrictive driver layers;

first and second controllable electromechanical grippers attached in said hollow space to said first and said second end surfaces, respectively, said grippers having cylindrical gripper inner peripheral surfaces along which said shaft is controllably and slidably movable and having gripper outer peripheral surfaces, each of said first and said second grippers comprising a pile having a plurality of electrostrictive gripper layers stacked transversely of said gripper inner peripheral surface of each of said first and said second grippers with gripper internal electrodes interposed between said electrostrictive gripper layers;

power supplying means for controllably supplying electrical power to said driver and to said first and said second grippers to make said driver and said first and said second grippers cooperate for axially moving said shaft in a stepwise manner;

driver connecting means for electrically connecting said driver internal electrodes to said power supplying means, said driver connecting means comprising first and second driver external electrodes along said driver outer peripheral surface, said first driver external electrode being electrically connected to alternate ones of said driver internal electrodes, said second driver external electrode being electrically connected to remaining ones of said driver internal electrodes;

gripper connecting means for electrically connecting said gripper internal electrodes of each of said first and said second grippers to said power supplying means, said gripper connecting means comprising first and second gripper external electrodes along said gripper outer peripheral surface, said first gripper external electrode being electrically connected to alternate ones of said gripper internal electrodes, said second gripper external electrode being electrically connected to remaining ones of said gripper internal electrodes; and an electrically insulating and vibration damping film formed on said gripper inner peripheral surface of each of said first and said second grippers, wherein said electrostrictive layers of said driver and said first and said second grippers are of a composition described by a chemical formula of $(1-X)$ Pb (Mg $\frac{1}{3}$ Nb $\frac{2}{3}$) O$_3$·X Pb Ti O$_3$; where X is about 0.35.

2. The electromechanical translation device as claimed in claim 1, wherein said electrically insulating and vibration damping film is of a ferrite composition having a logarithmic damping factor between 0.04 and 0.06.

3. The electromechanical translation device as claimed in claim 1, wherein said electrically insulating and vibration damping film is arranged in a matrix fashion on said gripper inner peripheral surface.

* * * * *